US012707973B2

(12) United States Patent
Chiou et al.

(10) Patent No.: US 12,707,973 B2
(45) Date of Patent: Aug. 11, 2026

(54) POWER MODULE

(71) Applicant: Industrial Technology Research Institute, Hsinchu (TW)

(72) Inventors: Shian-Chiau Chiou, Miaoli County (TW); Chun-Kai Liu, Hsinchu City (TW); Po-Kai Chiu, Taoyuan City (TW); Chih-Ming Tzeng, Hsinchu City (TW); Yao-Shun Chen, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 563 days.

(21) Appl. No.: 18/166,496

(22) Filed: Feb. 9, 2023

(65) Prior Publication Data

US 2024/0162114 A1 May 16, 2024

(30) Foreign Application Priority Data

Nov. 14, 2022 (TW) ................................ 111143376

(51) Int. Cl.
*H10W 72/20* (2026.01)
*H10W 40/73* (2026.01)
(Continued)

(52) U.S. Cl.
CPC .......... *H10W 40/73* (2026.01); *H10W 70/69* (2026.01); *H10W 72/07554* (2026.01);
(Continued)

(58) Field of Classification Search
CPC . H01L 23/427; H01L 23/49894; H01L 24/32; H01L 24/48; H01L 24/73;
(Continued)

(56) References Cited

U.S. PATENT DOCUMENTS

| | | | |
|---|---|---|---|
| 7,875,900 | B2 | 1/2011 | Meyer, IV et al. |
| 8,159,821 | B2 | 4/2012 | Tan et al. |

(Continued)

FOREIGN PATENT DOCUMENTS

| | | |
|---|---|---|
| CN | 101043809 | 9/2007 |
| CN | 202750388 | 2/2013 |

(Continued)

OTHER PUBLICATIONS

Kunio Koseki et al., "Feasibility Study of Ebullient Cooling Technology for SiC Power Devices With Extremely High Heat Generation Density of 1000 W/cm2", The 23rd International Conference on Electrical Machines and Systems (ICEMS), Nov. 24-27, 2020, pp. 1866-1871.

(Continued)

*Primary Examiner* — Zandra V Smith
*Assistant Examiner* — Daniel J Hibbert
(74) *Attorney, Agent, or Firm* — JCIPRNET

(57) ABSTRACT

A power module including at least one power device, an insulation thermally conductive layer, and a heat dissipation device is provided. The insulation thermally conductive layer has a patterned circuit layer. The power device is disposed on the patterned circuit layer and is electrically connected to the patterned circuit layer. The heat dissipation device includes a heat dissipation plate and a heat dissipation base. The heat dissipation plate has a first surface and a second surface opposite to each other, and the insulation thermally conductive layer is disposed on the first surface. The heat dissipation base is partially bonded to the heat dissipation plate, and a chamber is formed between the heat
(Continued)

dissipation plate and the heat dissipation bases. The heat dissipation base has a plurality of first heat dissipation bumps located in the chamber.

20 Claims, 8 Drawing Sheets

(51) Int. Cl.

| | |
|---|---|
| ***H10W 70/69*** | (2026.01) |
| ***H10W 72/50*** | (2026.01) |
| ***H10W 90/00*** | (2026.01) |
| *H10W 40/22* | (2026.01) |
| *H10W 72/00* | (2026.01) |

(52) U.S. Cl.
CPC ........ *H10W 72/884* (2026.01); *H10W 90/734* (2026.01); *H10W 90/754* (2026.01)

(58) Field of Classification Search
CPC . H01L 2224/32225; H01L 2224/48091; H01L 2224/48105; H01L 2224/48227; H01L 2224/73265; H01L 24/15; H01L 25/072; H01L 23/3735; H01L 23/367; H01L 23/3672; H01L 23/34–4735; H10W 40/73; H10W 70/69; H10W 72/07554; H10W 72/884; H10W 90/734; H10W 90/754; H10W 72/20; H10W 72/50; H10W 72/851; H10W 90/00; H10W 40/22; H10W 40/226; H10W 40/228; H10W 40/255
See application file for complete search history.

(56) References Cited

U.S. PATENT DOCUMENTS

| | | | | |
|---|---|---|---|---|
| 8,994,165 | B2 | 3/2015 | Oi et al. | |
| 9,220,184 | B2 | 12/2015 | Ranjan et al. | |
| 2014/0268572 | A1* | 9/2014 | Ranjan ............... | H05K 7/20336 361/700 |
| 2020/0025458 | A1 | 1/2020 | Takahashi et al. | |
| 2020/0411439 | A1* | 12/2020 | Teng ..................... | H10W 40/47 |

FOREIGN PATENT DOCUMENTS

| | | |
|---|---|---|
| CN | 202750388 U * | 2/2013 |
| CN | 103547111 | 1/2014 |
| CN | 111246708 | 6/2020 |
| TW | 201127266 | 8/2011 |
| TW | M537784 | 3/2017 |
| TW | M539762 | 4/2017 |
| TW | I641310 | 11/2018 |
| TW | I731578 | 6/2021 |

OTHER PUBLICATIONS

Wei Mu et al., "Direct Integration of Optimized Phase-Change Heat Spreaders Into SiC Power Module for Thermal Performance Improvements Under High Heat Flux", IEEE Transactions on Power Electronics, vol. 37, No. 5, May 2022, pp. 5398-5410.

"Office Action of Taiwan Counterpart Application", issued on Aug. 15, 2023, p. 1-p. 3.

* cited by examiner 100A
110 {1101 1102
120 {121 122
130
121
1102
1107
1106
1101
150
122
140
1105
1104
1103
R1
R2
G1
G2

110
1101
1102
120
121
122
100E
1106
140
R2
1104
R1
1103
101
G1
130
150

POWER MODULE

CROSS-REFERENCE TO RELATED APPLICATION

This application claims the priority benefit of Taiwan application serial no. 111143376, filed on Nov. 14, 2022. The entirety of the above-mentioned patent application is hereby incorporated by reference herein and made a part of this specification.

TECHNICAL FIELD

The disclosure relates to a power module.

BACKGROUND

A common power module includes a ceramic substrate carrying multiple power devices. The ceramic substrate is thermally coupled to a heat dissipator (e.g., heat dissipation fins). The heat generated by the power devices during operation may be conducted to the heat dissipator through the ceramic substrate, and then the heat is exchanged between the heat dissipator and cold air to discharge the heat. Specifically, the ceramic substrate includes an upper copper foil, an intermediate ceramic layer, and a lower copper foil. The power devices are disposed on the upper copper foil, and the lower copper foil is bonded to a metal baseplate (e.g., a copper baseplate) through a solder layer. In addition, the metal baseplate is bonded to the heat dissipator through a thermal interface material layer.

The heat generated by the power devices during operation is conducted to the heat dissipator sequentially through the upper copper foil, the intermediate ceramic layer, the lower copper foil, the solder layer, the metal baseplate, and the thermal interface material layer. Since the heat conduction path is long, the heat dissipation efficiency is not good. In addition, during operation, the power devices form multiple heat sources on the ceramic substrate, and multiple hot spots are formed due to local concentration or accumulation of heat. When the heat cannot be quickly discharged outside, warpage, cracking, or delamination of the intermediate ceramic layer occurs due to thermal stress, which will lead to a decline in the performance and reliability of the power module.

SUMMARY

A power module according to an embodiment of the disclosure includes at least one power device, an insulation thermally conductive layer, and a heat dissipation device. The insulation thermally conductive layer has a patterned circuit layer. The power device is disposed on the patterned circuit layer and electrically connected to the patterned circuit layer. The heat dissipation device includes a heat dissipation plate and a heat dissipation base. The heat dissipation plate has a first surface and a second surface opposite to each other. The insulation thermally conductive layer is disposed on the first surface. The heat dissipation base is partially bonded to the heat dissipation plate. A chamber is formed between the heat dissipation plate and the heat dissipation base. The heat dissipation base has a plurality of first heat dissipation bumps located in the chamber.

A power module according to another embodiment of the disclosure includes at least one power device, an insulation thermally conductive layer, and a heat dissipation device. The insulation thermally conductive layer has a patterned circuit layer. The power device is disposed on the patterned circuit layer and electrically connected to the patterned circuit layer. The heat dissipation device includes a heat dissipation plate and a heat dissipation base. The heat dissipation plate has a first surface and a second surface opposite to each other. The insulation thermally conductive layer is disposed on the first surface. The heat dissipation base is partially bonded to the heat dissipation plate. A chamber is formed between the heat dissipation plate and the heat dissipation base. The heat dissipation plate has a plurality of first heat dissipation bumps located in the chamber.

Several exemplary embodiments accompanied with figures are described in detail below to further describe the disclosure in details.

BRIEF DESCRIPTION OF THE DRAWINGS

The accompanying drawings are included to provide a further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1:
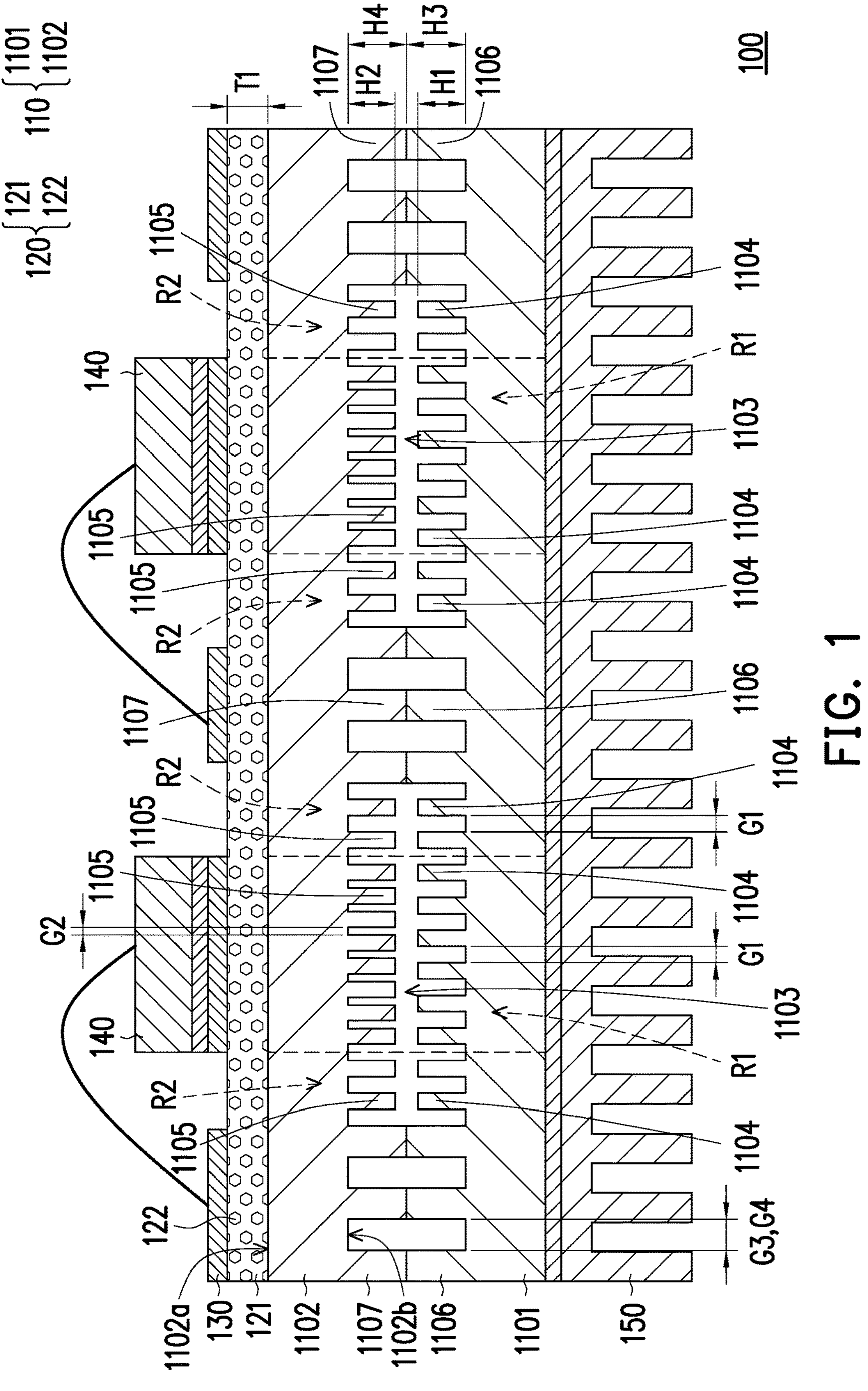
FIG. 1 is a schematic cross-sectional view of a power module according to a first embodiment of the disclosure.

FIG. 1 is a schematic cross-sectional view of a power module according to a first embodiment of the disclosure. Referring to FIG. 1, in this embodiment, a power module 100 includes a heat dissipation device 110, an insulation thermally conductive layer 120, and at least one power device 140. The insulation thermally conductive layer 120 is located between the power device 140 and the heat dissipation device 110. The insulation thermally conductive layer 120 has a patterned circuit layer 130. The power device 140 is disposed on the patterned circuit layer 130 and is electrically connected to the patterned circuit layer 130. In addition, the patterned circuit layer 130 is located between the power device 140 and the insulation thermally conductive layer 120.

The heat dissipation device 110 includes a heat dissipation base 1101 and a heat dissipation plate 1102. The heat dissipation plate 1102 has a first surface **1102*a* and a second surface 1102*b* opposite to each other, and the insulation thermally conductive layer 120 is disposed on the first surface 1102*a*. In addition, the heat dissipation base 1101 is partially bonded to the heat dissipation plate 1102, and a chamber 1103** is formed between the heat dissipation plate 1102 and the heat dissipation base 1101. For example, the heat dissipation plate 1102 may be bonded to the heat dissipation base 1101 by resistance welding, laser welding, arc welding, plasma welding, or another applicable welding process, and the chamber 1103 formed between the heat dissipation plate 1102 and the heat dissipation base 1101 may be a vacuum chamber to accommodate a working fluid (e.g., water or a refrigerant).

Referring to FIG. 1, in this embodiment, the power module 100 further includes a heat dissipator 150, and the insulation thermally conductive layer 120 and the heat dissipator 150 are respectively located on two opposite sides of the heat dissipation device 110. The heat dissipator 150 may be heat dissipation fins and may be bonded to the bottom of the heat dissipation base 1101 by a soldering process, for example. That is, the heat dissipation base 1101 is located between the heat dissipation plate 1102 and the heat dissipator 150.

For example, the patterned circuit layer 130 may be bonded onto the insulation thermally conductive layer 120 by a thermo-compression bonding process, and the insulation thermally conductive layer 120 may be bonded onto the first surface 1102*a* by a thermo-compression bonding process. The power device 140 may be bonded onto the patterned circuit layer 130 by a soldering process, and may be electrically connected to the patterned circuit layer 130 by a wire bonding process.

Referring to FIG. 1, the power device 140 may be a power chip, and the heat generated during operation is conducted to the heat dissipator 150 sequentially through the patterned circuit layer 130, the insulation thermally conductive layer 120, the heat dissipation plate 1102, and the heat dissipation base 1101. Since the heat conduction path is shortened, the heat generated by the power device 140 during operation could be quickly conducted to the heat dissipator 150, and then heat is exchanged between the heat dissipator 150 and cold air to quickly discharge the heat, which greatly improves the heat dissipation efficiency. In addition, the shortening of the heat conduction path means that the overall thickness of the power module 100 is reduced, so the design requirements for lightness and thinness could be satisfied.

Further, when the heat generated by the power device 140 during operation is conducted to the heat dissipation device 110 through the insulation thermally conductive layer 120, the heat dissipation device 110 transfers heat from a point to over a surface, which avoids local concentration or accumulation of heat, prevents warpage, cracking, or delamination of the insulation thermally conductive layer 120 due to thermal stress, and helps to improve the performance and reliability of the power module 100.

For example, the insulation thermally conductive layer 120 includes an insulating body 121 and a thermally conductive filler 122 distributed in the insulating body 121. The insulating body 121 may be made of epoxy resin, BT resin, cyanate resin, polyamideimide resin, polyimide resin, or another resin. The thermally conductive filler 122 may include silicon dioxide, boron nitride, aluminum oxide, aluminum nitride, silicon nitride, diamond, or a combination thereof. In an example, a thermal conductivity of the insulation thermally conductive layer 120 is between 3 W/mK and 15 W/mK, and a thickness T1 of the insulation thermally conductive layer 120 is between 100 μm and 300 μm. That is, the insulation thermally conductive layer 120 not only has a lower thermal resistance to accelerate heat conduction, but also has a smaller thickness to shorten the heat conduction path.

Referring to FIG. 1, in this embodiment, an orthographic projection of the power device 140 falls in the chamber 1103 to shorten the heat conduction path. Specifically, the heat dissipation base 1101 has a plurality of first heat dissipation bumps 1104 located in the chamber 1103, the heat dissipation plate 1102 has a plurality of second heat dissipation bumps 1105 located on the second surface 1102*b*, and the second heat dissipation bumps 1105 are located in the chamber 1103. On the other hand, the heat dissipation device 110 has a first region R1 corresponding to the power device 140 and a second region R2 adjacent to the first region R1, and the second region R2 is distributed around the first region R1. That is, the second region R2 surrounds the first region R1.

Further, the orthographic projection of the power device 140 on the heat dissipation device 110 at least partially overlaps with the first region R1. In this embodiment, the orthographic projection of the power device 140 on the heat dissipation device 110 falls within the first region R1, as shown in FIG. 1.

Specifically, the second heat dissipation bumps 1105 are closer to the heat source (i.e., the power device 140) than the first heat dissipation bumps 1104, so the region where the second heat dissipation bumps 1105 are located in the chamber 1103 may be regarded as an evaporation region. In contrast, the region where the first heat dissipation bumps 1104 are located in the chamber 1103 may be regarded as a condensation region. When heat is conducted to the heat dissipation device 110, the liquid working fluid (e.g., water or a refrigerant) in the chamber 1103 absorbs the heat from the second heat dissipation bumps 1105 and evaporates into a gaseous working fluid. Since the first heat dissipation bumps 1104 are farther away from the heat source (i.e., the power device 140) than the second heat dissipation bumps 1105, and the heat may be further conducted to the heat dissipator 150 through the heat dissipation base 1101, the gaseous working fluid may be condensed into a liquid working fluid in the lower-temperature condensation region (i.e., the region where the first heat dissipation bumps 1104 are located in the chamber 1103), and then flow back to the higher-temperature evaporation region (i.e., the region where the second heat dissipation bumps 1105 are located in the chamber 1103).

Referring to FIG. 1, when the gaseous working fluid is condensed into a liquid working fluid in the condensation region (i.e., the region where the first heat dissipation bumps 1104 are located in the chamber 1103), a capillary force may be generated in the liquid working fluid due to the first heat dissipation bumps 1104, and the liquid working fluid may rise back to the evaporation region (i.e., the region where the second heat dissipation bumps 1105 are located in the chamber 1103). Then, a capillary force may be further generated in the liquid working fluid due to the second heat dissipation bumps 1105, and the liquid working fluid may move in a direction toward the heat source (i.e., the power device 140) to accelerate the cycle of evaporation and condensation of the working fluid.

In the first region R1 and the second region R2, the first heat dissipation bumps 1104 extend toward the heat dissipation plate 1102 and are not in contact with the second heat dissipation bumps 1105. Correspondingly, in the first region R1 and the second region R2, the second heat dissipation bumps 1105 extend toward the heat dissipation base 1101 and are not in contact with the first heat dissipation bumps 1104.

As shown in FIG. 1, a part of the plurality of first heat dissipation bumps 1104 is arranged in the first region R1 at a first density (i.e., first number of bumps per unit area), and another part is arranged in the second region R2 at a second density (i.e., second number of bumps per unit area) equal to the first density. On the other hand, a part of the plurality of second heat dissipation bumps 1105 is arranged in the first region R1 at a third density (i.e., third number of bumps per unit area), and another part is arranged in the second region R2 at a fourth density (i.e., fourth number of bumps per unit area) different from the third density. In this embodiment, the third density may be greater than the first density, the second density, and the fourth density, and the fourth density may be equal to the first density and the second density. Since the second heat dissipation bumps 1105 in the first region R1 are distributed at a high density, the heat exchange area is increased, which helps to accelerate the evaporation of the liquid working fluid into a gaseous working fluid to improve the heat dissipation efficiency.

As shown in FIG. 1, in the first region R1 and the second region R2, a gap between two adjacent first heat dissipation bumps 1104 is G1. In the second region R2, a gap between two adjacent second heat dissipation bumps 1105 is G1. In addition, in the first region R1, a gap between two adjacent second heat dissipation bumps 1105 is G2. The gap G2 is smaller than the gap G1. In this embodiment, the gap G1 is between 0.8 mm and 1.1 mm, and the gap G2 is between 0.08 mm and 0.1 mm. Since the second heat dissipation bumps 1105 in the first region R1 are arranged at a narrow pitch, the capillary force could be increased to accelerate the rise of the liquid working fluid.

For example, the first heat dissipation bump 1104 and the second heat dissipation bump 1105 may be columns, cones, or spheres. In other words, a cross-sectional shape of the first heat dissipation bump 1104 and the second heat dissipation bump 1105 may be a rectangle, a square, a parallelogram, a trapezoid, a triangle, a circle, an ellipse, a drop shape, a bullet shape, or another geometric shape. A width of the first heat dissipation bump 1104 may be equal to a width of the second heat dissipation bump 1105 and may be between 0.8 mm and 1.1 mm but is not limited thereto. In addition, a height H1 of the first heat dissipation bump 1104 may be equal to a height H2 of the second heat dissipation bump 1105 and may be between 1 mm and 1.5 mm.

Referring to FIG. 1, in this embodiment, the heat dissipation base 1101 has a plurality of first supports 1106 located outside the first region R1 and the second region R2 or located between two adjacent second regions R2. Correspondingly, the heat dissipation plate 1102 has a plurality of second supports 1107 located on the second surface 1102*b* and located outside the first region R1 and the second region R2 or located between two adjacent second regions R2.

The first supports 1106 and the second supports 1107 are located between the heat dissipation base 1101 and the heat dissipation plate 1102, and the heat dissipation base 1101 and the heat dissipation plate 1102 are bonded to each other through the first supports 1106 and the second supports 1107 by, for example, resistance welding, laser welding, arc welding, plasma welding, or another applicable welding process. The first supports 1106 and the second supports 1107 which are in contact or bonded with each other may serve as a support structure of the heat dissipation device 110 to prevent depression or collapse.

As shown in FIG. 1, a height H3 of the first support 1106 may be equal to a height H4 of the second support 1107 and may be between 2 mm and 2.5 mm. The height H3 of the first support 1106 is greater than the height H1 of the first heat dissipation bump 1104, and the height H4 of the second support 1107 is greater than the height H2 of the second heat dissipation bump 1105. With this height difference design, the first heat dissipation bumps 1104 in the chamber 1103 are not in contact with the second heat dissipation bumps 1105.

As shown in FIG. 1, a width of the first support 1106 may be equal to a width of the second support 1107 and may be between 1.5 mm and 2 mm but is not limited thereto. The width of the first support 1106 may be greater than the width of the first heat dissipation bump 1104, and the width of the second support 1107 may be greater than the width of the second heat dissipation bump 1105. On the other hand, a gap G3 between two adjacent first supports 1106 may be equal to a gap G4 between two adjacent second supports 1107 and may be between 1.5 mm and 2 mm, for example, greater than the gaps G1 and G2. In other examples, the gap G3 between two adjacent first supports 1106 may be greater than the gap G4 between two adjacent second supports 1107.

Figure 2:
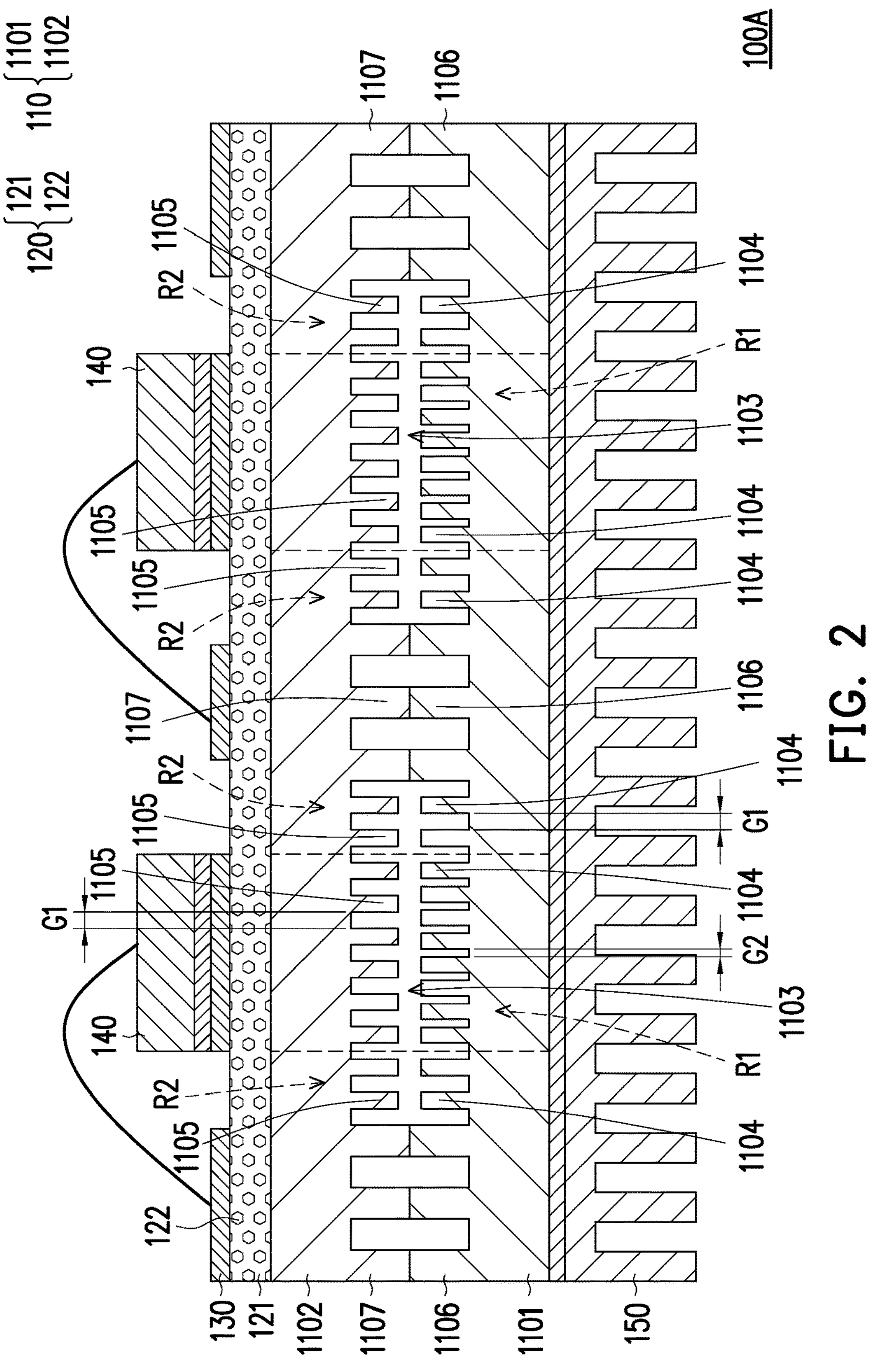
FIG. 2 is a schematic cross-sectional view of a power module according to a second embodiment of the disclosure.

FIG. 2 is a schematic cross-sectional view of a power module according to a second embodiment of the disclosure. Referring to FIG. 2, a power module 100A of this embodiment has a substantially same structural design as the power module 100 of the first embodiment, and the difference lies in that, in this embodiment, the first heat dissipation bumps 1104 in the first region R1 are arranged at a high density, and the second heat dissipation bumps 1105 in the first region R1 are arranged at a low density. Since the first heat dissipation bumps 1104 in the first region R1 are arranged at a high density, the heat exchange area is increased, which helps to accelerate the condensation of the gaseous working fluid into a liquid working fluid.

Specifically, in the first region R1 and the second region R2, the gap between two adjacent second heat dissipation bumps 1105 is G1. In the first region R1, the gap between two adjacent first heat dissipation bumps 1104 is G2. In addition, in the second region R2, the gap between two adjacent first heat dissipation bumps 1104 is G1, and the gap G2 is smaller than the gap G1. Since the first heat dissipation bumps 1104 in the first region R1 are arranged at a narrow pitch, the capillary force could be increased to accelerate the rise of the liquid working fluid.

As shown in FIG. 2, the arrangement density of the first heat dissipation bumps 1104 in the first region R1 is greater than the arrangement density of the first heat dissipation bumps 1104 in the second region R2. The arrangement density of the second heat dissipation bumps 1105 in the first region R1 is equal to the arrangement density of the second heat dissipation bumps 1105 in the second region R2, and is equal to the arrangement density of the first heat dissipation bumps 1104 in the second region R2.

Figure 3:
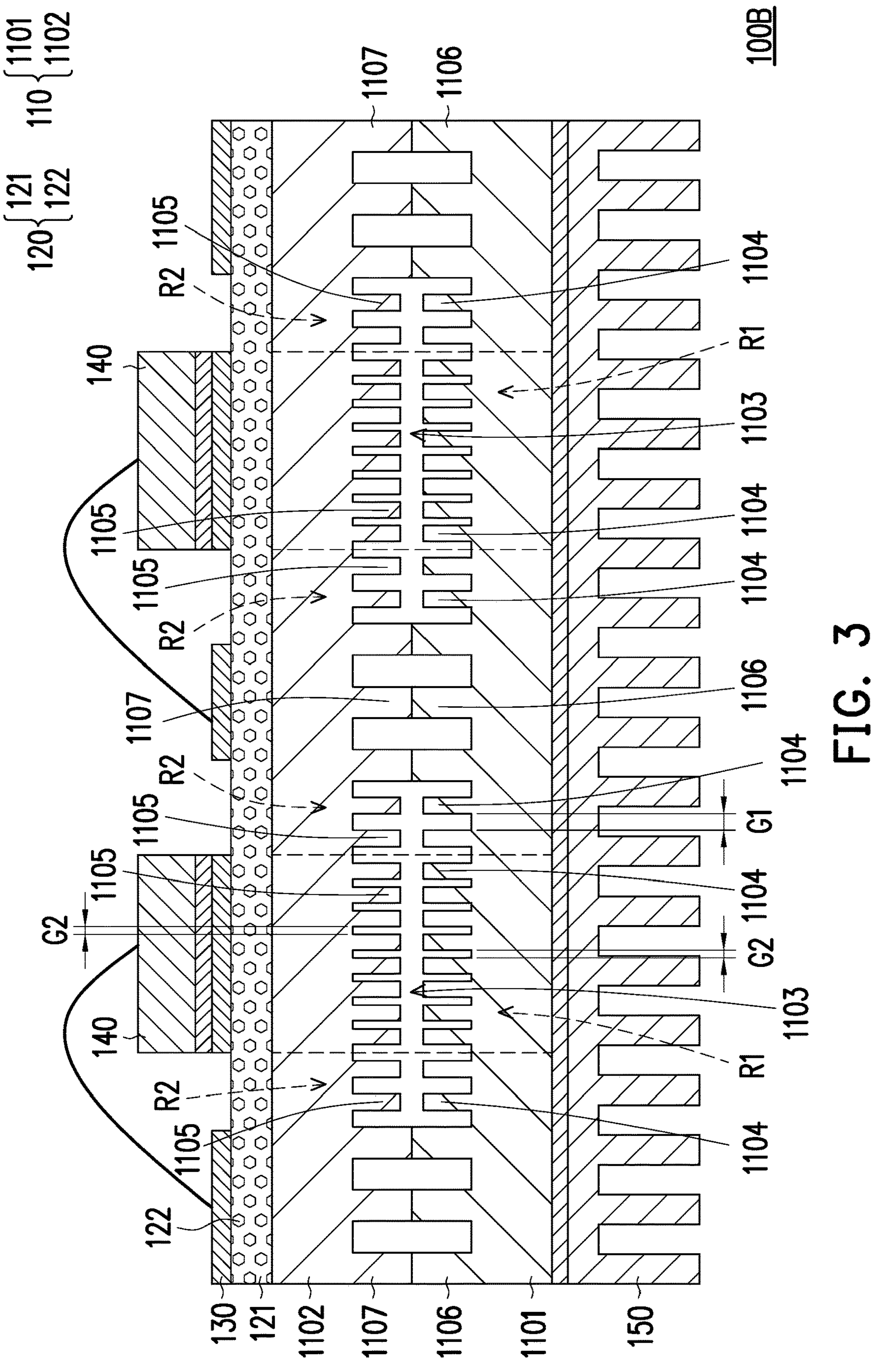
FIG. 3 is a schematic cross-sectional view of a power module according to a third embodiment of the disclosure.

FIG. 3 is a schematic cross-sectional view of a power module according to a third embodiment of the disclosure. Referring to FIG. 3, a power module 100B of this embodiment has a substantially same structural design as the power module 100 of the first embodiment, and the difference lies in that, in this embodiment, the first heat dissipation bumps 1104 and the second heat dissipation bumps 1105 in the first region R1 are arranged at a high density. Since the first heat dissipation bumps 1104 in the first region R1 are arranged at a high density, the heat exchange area is increased, which helps to accelerate the condensation of the gaseous working fluid into a liquid working fluid. Since the second heat dissipation bumps 1105 in the first region R1 are distributed at a high density, the heat exchange area is increased, which helps to accelerate the evaporation of the liquid working fluid into a gaseous working fluid to improve the heat dissipation efficiency.

Specifically, in the second region R2, the gap between two adjacent first heat dissipation bumps 1104 and the gap between two adjacent second heat dissipation bumps 1105 are G1. In the first region R1, the gap between two adjacent first heat dissipation bumps 1104 and the gap between two adjacent second heat dissipation bumps 1105 are both G2, and the gap G2 is smaller than the gap G1. Since the first heat dissipation bumps 1104 and the second heat dissipation bumps 1105 in the first region R1 are both arranged at a narrow pitch, the capillary force could be increased to accelerate the rise of the liquid working fluid.

As shown in FIG. 3, the arrangement density of the first heat dissipation bumps 1104 in the first region R1 is greater than the arrangement density of the first heat dissipation bumps 1104 in the second region R2, and the arrangement density of the second heat dissipation bumps 1105 in the first region R1 is greater than the arrangement density of the second heat dissipation bumps 1105 in the second region R2. In addition, the arrangement density of the first heat dissipation bumps 1104 in the first region R1 is equal to the arrangement density of the second heat dissipation bumps 1105 in the first region R1, and the arrangement density of the first heat dissipation bumps 1104 in the second region R2 is equal to the arrangement density of the second heat dissipation bumps 1105 in the second region R2.

Figure 4:
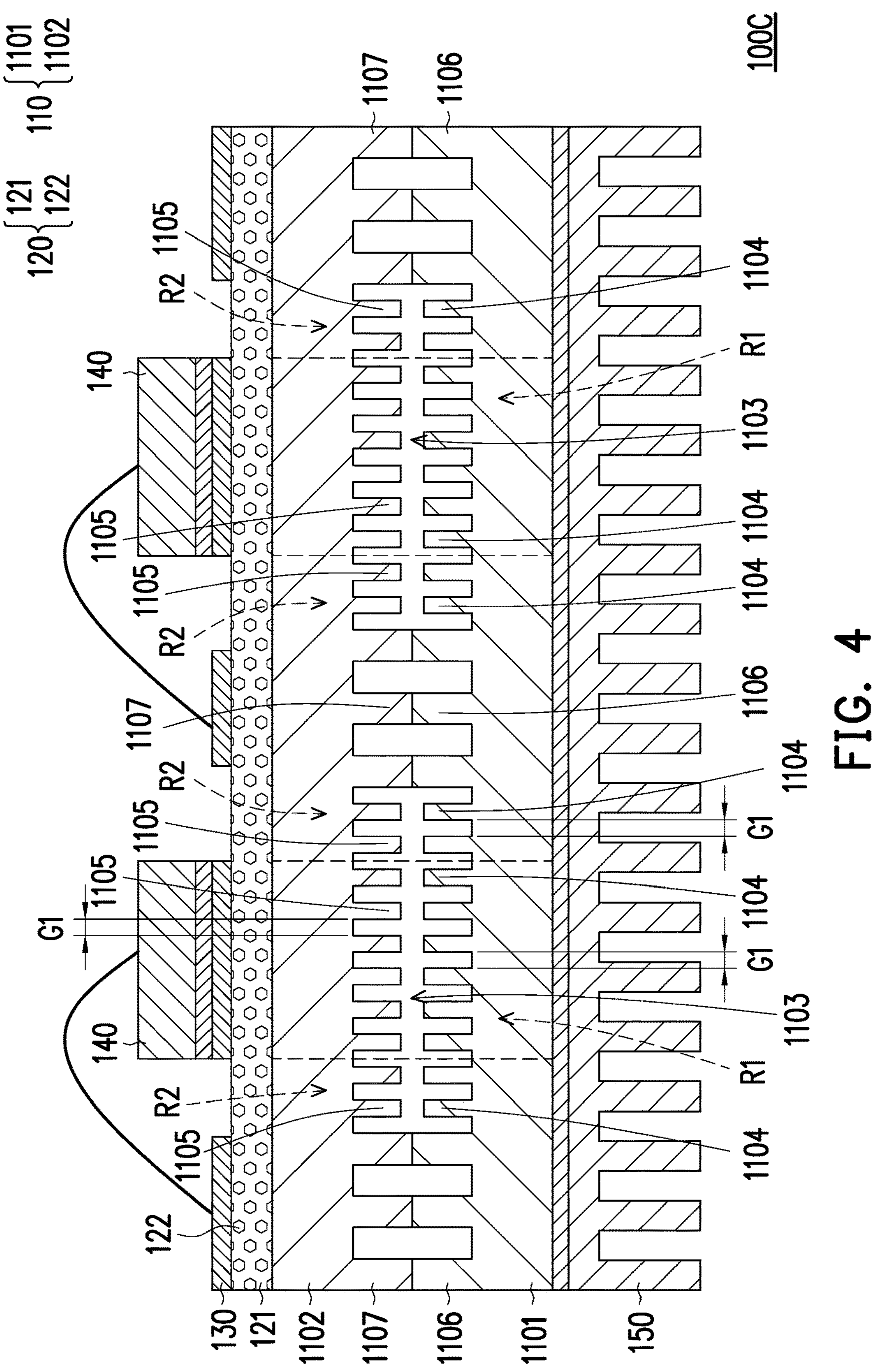
FIG. 4 is a schematic cross-sectional view of a power module according to a fourth embodiment of the disclosure.

FIG. 4 is a schematic cross-sectional view of a power module according to a fourth embodiment of the disclosure. Referring to FIG. 4, a power module 100C of this embodiment has a substantially same structural design as the power module 100 of the first embodiment, and the difference lies in that, in this embodiment, the first heat dissipation bumps 1104 and the second heat dissipation bumps 1105 in the first region R1 are both arranged at a low density. Specifically, in the first region R1 and the second region R2, the gap between two adjacent first heat dissipation bumps 1104 and the gap between two adjacent second heat dissipation bumps 1105 are G1.

As shown in FIG. 4, the arrangement density of the first heat dissipation bumps 1104 in the first region R1 is equal to the arrangement density of the first heat dissipation bumps 1104 in the second region R2, and the arrangement density of the second heat dissipation bumps 1105 in the first region R1 is equal to the arrangement density of the second heat dissipation bumps 1105 in the second region R2. In addition, the arrangement density of the first heat dissipation bumps 1104 in the first region R1 is equal to the arrangement density of the second heat dissipation bumps 1105 in the first region R1, and the arrangement density of the first heat dissipation bumps 1104 in the second region R2 is equal to the arrangement density of the second heat dissipation bumps 1105 in the second region R2.

Figure 5:
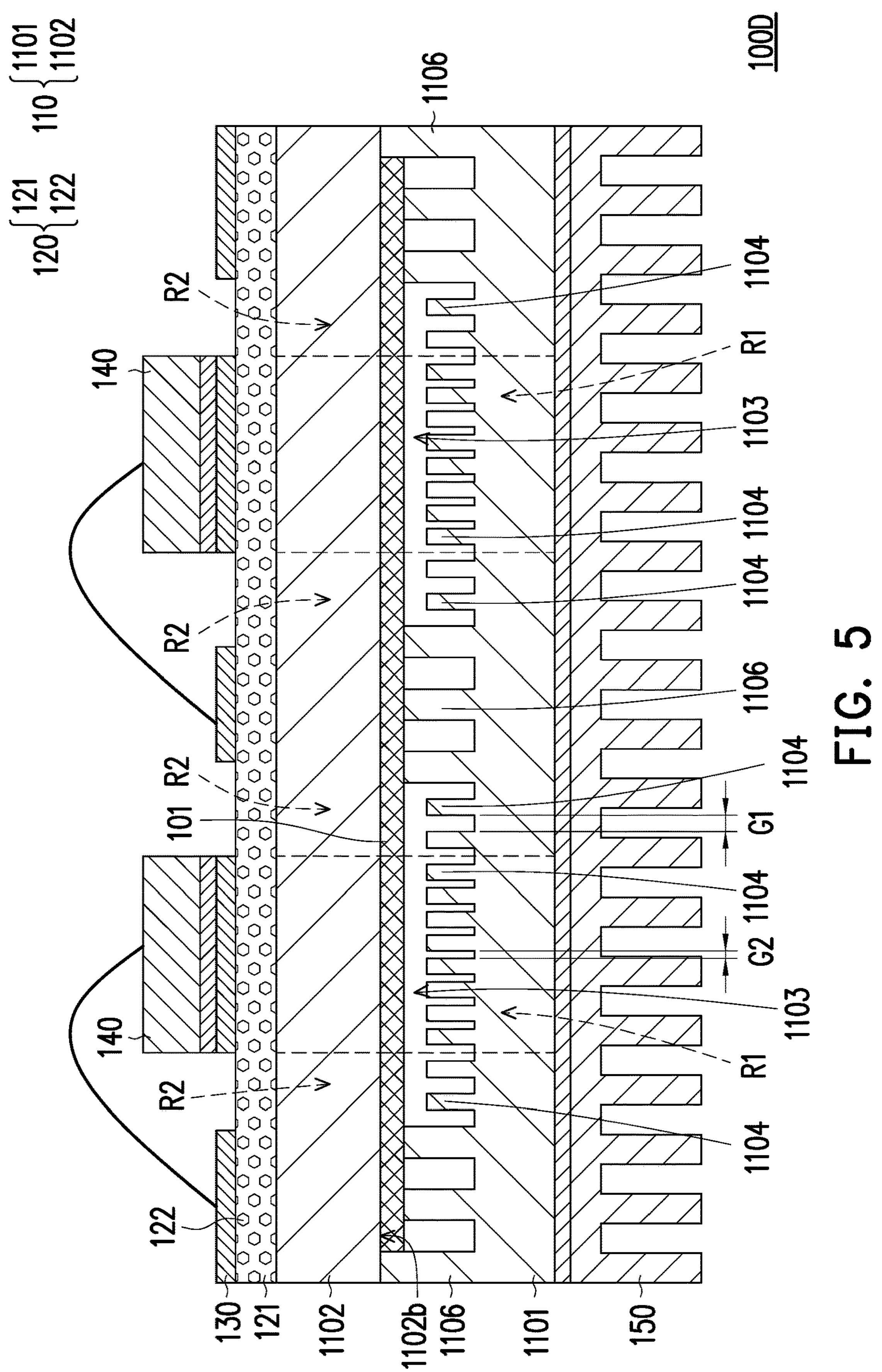
FIG. 5 is a schematic cross-sectional view of a power module according to a fifth embodiment of the disclosure.

FIG. 5 is a schematic cross-sectional view of a power module according to a fifth embodiment of the disclosure. Referring to FIG. 5, a power module 100D of this embodiment has a substantially same structural design as the power module 100A of the second embodiment, and the difference lies in that, in this embodiment, the heat dissipation plate 1102 is not provided with the second heat dissipation bumps 1105 and the second supports 1107 on the second surface 1102*b*. Specifically, the heat dissipation plate 1102 has a capillary structure layer 101. The capillary structure layer 101 is disposed on the second surface 1102*b* and located in the chamber 1103. A part of the plurality of first supports 1106 on the heat dissipation base 1101 is bonded to the heat dissipation plate 1102, and another part of the plurality of first supports 1106 on the heat dissipation base 1101 is bonded to the capillary structure layer 101.

Specifically, some sections of the capillary structure layer 101 are located in the first region R1 and the second region R2, which helps to increase the heat exchange area to accelerate the evaporation of the liquid working fluid into a gaseous working fluid and improve the heat dissipation efficiency. In addition, the capillary structure layer 101 also helps to increase the capillary force to accelerate the rise of the liquid working fluid.

In the second region R2, the gap between two adjacent first heat dissipation bumps 1104 is G1. In the first region R1, the gap between two adjacent first heat dissipation bumps 1104 is G2, and the gap G2 is smaller than the gap G1. That is, the arrangement density of the first heat dissipation bumps 1104 in the first region R1 is greater than the arrangement density of the first heat dissipation bumps 1104 in the second region R2.

Furthermore, since the first heat dissipation bumps 1104 in the first region R1 are arranged at a narrow pitch, the capillary force could be increased to accelerate the rise of the liquid working fluid. In addition, since the first heat dissipation bumps 1104 in the first region R1 are arranged at a high density, the heat exchange area is increased, which helps to accelerate the condensation of the gaseous working fluid into a liquid working fluid.

Figure 6:
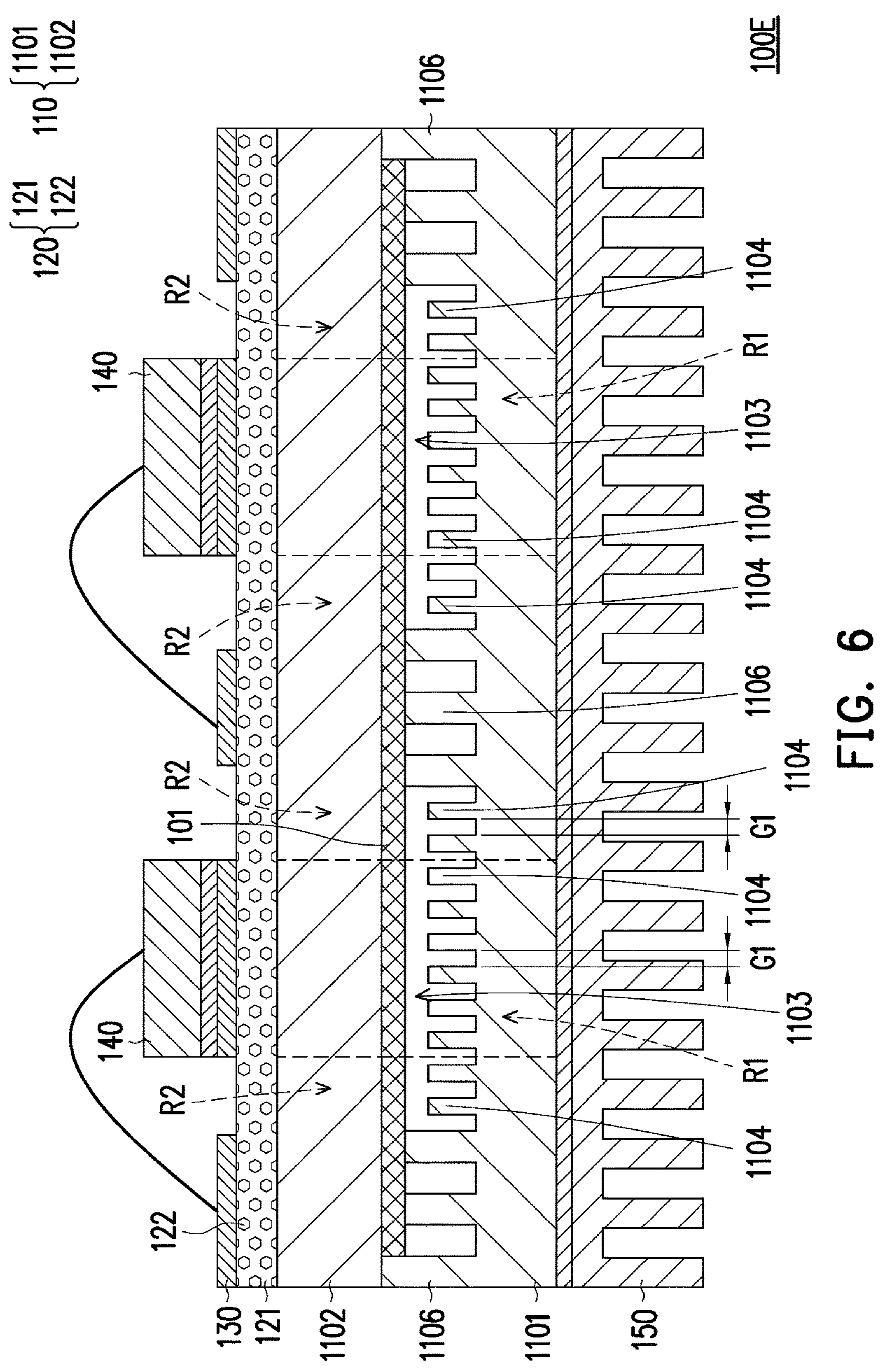
FIG. 6 is a schematic cross-sectional view of a power module according to a sixth embodiment of the disclosure.

FIG. 6 is a schematic cross-sectional view of a power module according to a sixth embodiment of the disclosure. Referring to FIG. 6, a power module 100E of this embodiment has a substantially same structural design as the power module 100D of the fifth embodiment, and the difference lies in that, in this embodiment, the first heat dissipation bumps 1104 in the first region R1 are arranged at a low density. Specifically, in the first region R1 and the second region R2, the gap between two adjacent first heat dissipation bumps 1104 is G1. That is, the arrangement density of the first heat dissipation bumps 1104 in the first region R1 is equal to the arrangement density of the first heat dissipation bumps 1104 in the second region R2.

Figure 7:
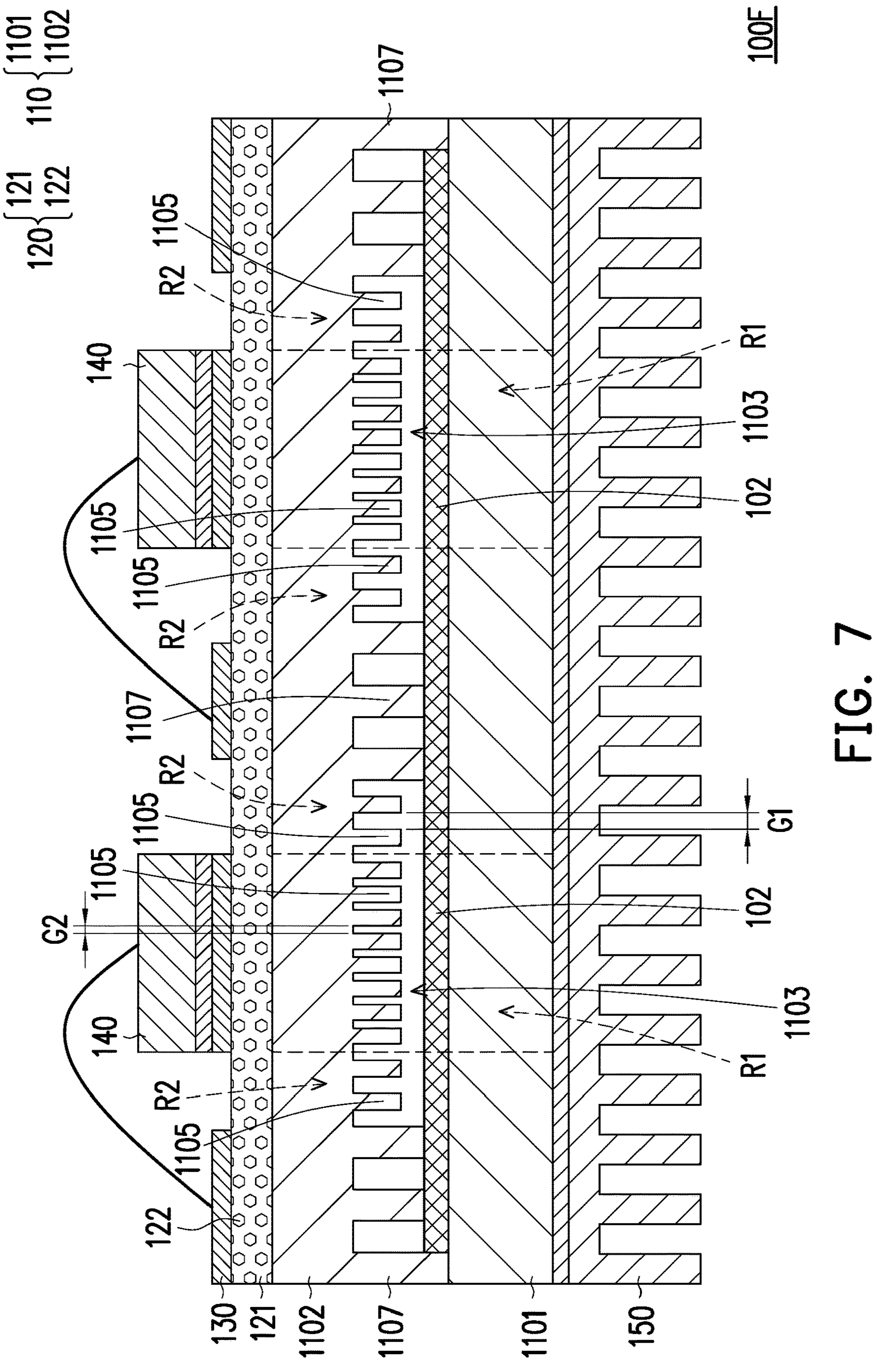
FIG. 7 is a schematic cross-sectional view of a power module according to a seventh embodiment of the disclosure.

FIG. 7 is a schematic cross-sectional view of a power module according to a seventh embodiment of the disclosure. Referring to FIG. 7, a power module 100F of this embodiment has a substantially same structural design as the power module 100A of the second embodiment, and the difference lies in that, in this embodiment, the heat dissipation base 1101 is not provided with the first heat dissipation bumps 1104 and the first supports 1106 on the surface facing the heat dissipation plate 1102. Specifically, the heat dissipation base 1101 is provided with a capillary structure layer 102 on the surface facing the heat dissipation plate 1102, and the capillary structure layer 102 is located in the chamber 1103. A part of the plurality of second supports 1107 on the heat dissipation plate 1102 is bonded to the heat dissipation base 1101, and another part of the plurality of second supports 1107 on the heat dissipation plate 1102 is bonded to the capillary structure layer 102.

Specifically, some sections of the capillary structure layer 102 are located in the first region R1 and the second region R2, which helps to increase the heat exchange area to accelerate the condensation of the gaseous working fluid into a liquid working fluid and improve the heat dissipation efficiency. In addition, the capillary structure layer 102 also helps to increase the capillary force to accelerate the rise of the liquid working fluid.

In the second region R2, the gap between two adjacent second heat dissipation bumps 1105 is G1. In the first region R1, the gap between two adjacent second heat dissipation bumps 1105 is G2, and the gap G2 is smaller than the gap G1. That is, the arrangement density of the second heat dissipation bumps 1105 in the first region R1 is greater than the arrangement density of the second heat dissipation bumps 1105 in the second region R2.

Furthermore, since the second heat dissipation bumps 1105 in the first region R1 are arranged at a narrow pitch, the capillary force could be increased to accelerate the rise of the liquid working fluid. In addition, since the second heat dissipation bumps 1105 in the first region R1 are arranged at a high density, the heat exchange area is increased, which helps to accelerate the evaporation of the liquid working fluid into a gaseous working fluid.

Figure 8:
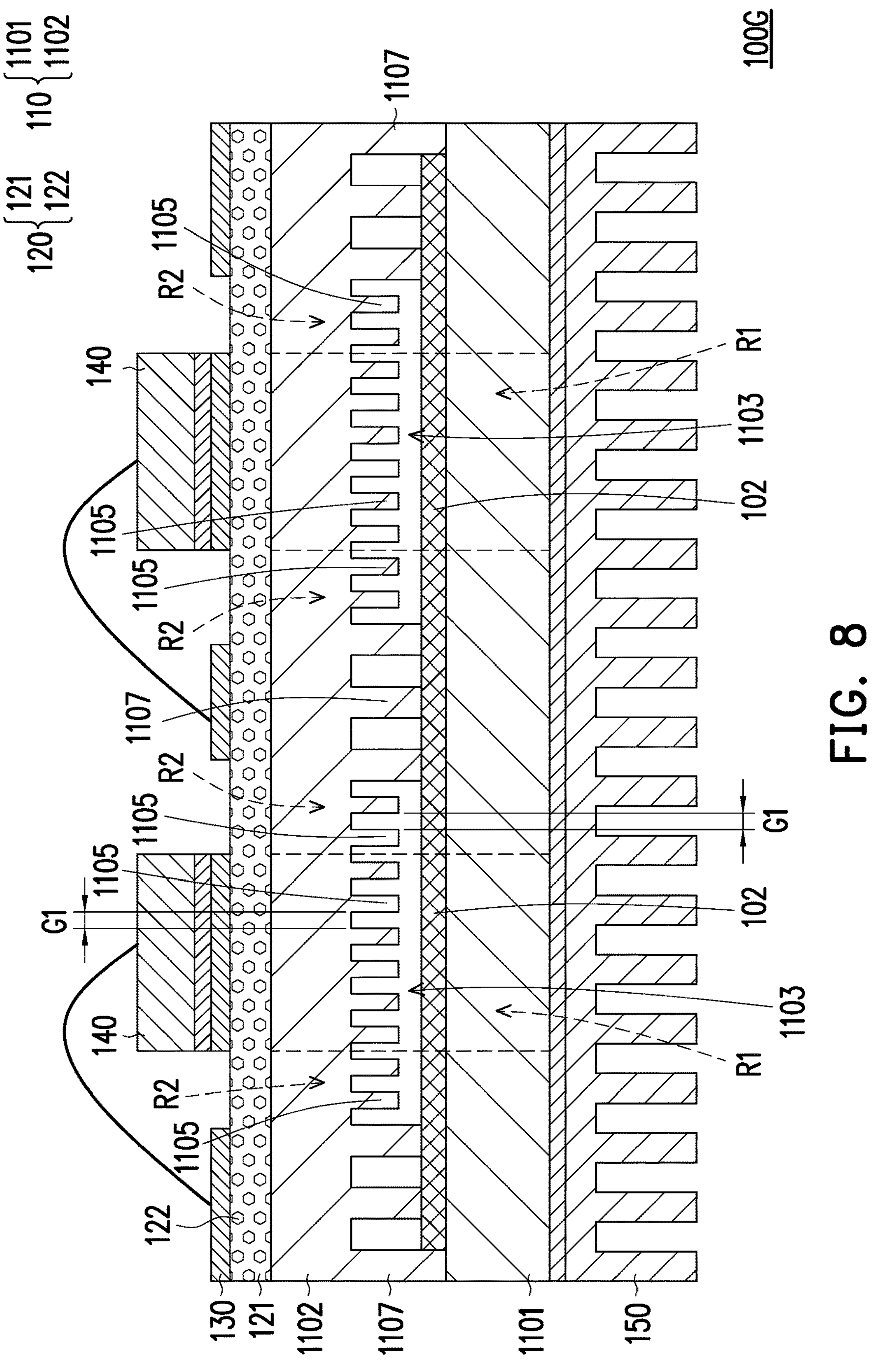
FIG. 8 is a schematic cross-sectional view of a power module according to an eighth embodiment of the disclosure.

FIG. 8 is a schematic cross-sectional view of a power module according to an eighth embodiment of the disclosure. Referring to FIG. 8, a power module 100G of this embodiment has a substantially same structural design as the power module 100F of the seventh embodiment, and the difference lies in that, in this embodiment, the second heat dissipation bumps 1105 in the first region R1 are arranged at a low density. Specifically, in the first region R1 and the second region R2, the gap between two adjacent second heat dissipation bumps 1105 is G1. That is, the arrangement density of the second heat dissipation bumps 1105 in the first region R1 is equal to the arrangement density of the second heat dissipation bumps 1105 in the second region R2.

In summary of the above, in the power module of the disclosure, the heat generated by the power devices during operation is conducted to the heat dissipator sequentially through the patterned circuit layer, the insulation thermally conductive layer, the heat dissipation plate, and heat dissipation base. Since the heat conduction path is shortened, the heat generated by the power devices during operation could be quickly conducted to the heat dissipator, and then the heat is exchanged between the heat dissipator and cold air to quickly discharge the heat, which greatly improves the heat dissipation efficiency. In addition, the shortening of the heat conduction path means that the overall thickness of the power module is reduced, so the design requirements for lightness and thinness could be satisfied.

Furthermore, when the heat generated by the power devices during operation is conducted to the heat dissipation device through the insulation thermally conductive layer, the heat dissipation device transfers heat from a point to over a surface, which avoids local concentration or accumulation of heat, prevents warpage, cracking, or delamination of the insulation thermally conductive layer due to thermal stress, and helps to improve the performance and reliability of the power module. In addition, the insulation thermally conductive layer not only has a lower thermal resistance to accelerate heat conduction, but also has a smaller thickness to shorten the heat conduction path.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A power module comprising:

at least one power device;

an insulation thermally conductive layer having a patterned circuit layer, wherein the power device is disposed on the patterned circuit layer and electrically connected to the patterned circuit layer; and a heat dissipation device comprising:

a heat dissipation plate having a first surface and a second surface opposite to each other, wherein the insulation thermally conductive layer is disposed on the first surface; and a heat dissipation base partially bonded to the heat dissipation plate, wherein a chamber is formed between the heat dissipation plate and the heat dissipation base, wherein the heat dissipation base has a plurality of first heat dissipation bumps, and the first heat dissipation bumps are located in the chamber, wherein a gap between any two adjacent of a first part of the first heat dissipation bumps overlapping with an orthographic projection of the power device is different from a gap between any two adjacent of a second part of the first heat dissipation bumps located outside of the orthographic projection of the power device.

2. The power module according to claim 1, wherein the heat dissipation device has a first region corresponding to the power device and a second region adjacent to the first region, and the first heat dissipation bumps are arranged in the first region at a first number of bumps per unit area and are arranged in the second region at a second number of bumps per unit area.

3. The power module according to claim 2, wherein the orthographic projection of the power device on the heat dissipation device at least partially overlaps with the first region.

4. The power module according to claim 2, wherein the second region surrounds the first region.

5. The power module according to claim 2, wherein the first number of bumps per unit area is equal to the second number of bumps per unit area.

6. The power module according to claim 2, wherein the first number of bumps per unit area is different from the second number of bumps per unit area.

7. The power module according to claim 2, wherein the heat dissipation plate has a plurality of second heat dissipation bumps, and the second heat dissipation bumps are located on the second surface of the heat dissipation plate.

8. The power module according to claim 7, wherein the second heat dissipation bumps are arranged in the first region at a third number of bumps per unit area and are arranged in the second region at a fourth number of bumps per unit area.

9. The power module according to claim 8, wherein the third number of bumps per unit area is different from the fourth number of bumps per unit area.

10. The power module according to claim 8, wherein the third number of bumps per unit area is greater than the fourth number of bumps per unit area.

11. The power module according to claim 10, wherein the fourth number of bumps per unit area is equal to the first number of bumps per unit area and the second number of bumps per unit area.

12. The power module according to claim 8, wherein the second number of bumps per unit area is equal to the fourth number of bumps per unit area.

13. The power module according to claim 7, wherein the first heat dissipation bumps and the second heat dissipation bumps are columns.

14. The power module according to claim 1, wherein the heat dissipation base has a plurality of first supports, the first supports are located between the heat dissipation base and the heat dissipation plate, and the heat dissipation base is bonded to the heat dissipation plate through the first supports.

15. The power module according to claim 14, wherein a height of the first supports is greater than a height of the first heat dissipation bumps.

16. The power module according to claim 7, wherein the heat dissipation plate has a plurality of second supports, the second supports are located between the heat dissipation base and the heat dissipation plate, and the heat dissipation plate is bonded to the heat dissipation base through the second supports.

17. The power module according to claim 1, wherein the heat dissipation plate has a capillary structure layer, and the capillary structure layer is disposed on the second surface.

18. A power module comprising:

at least one power device;

an insulation thermally conductive layer having a patterned circuit layer, wherein the power device is disposed on the patterned circuit layer and electrically connected to the patterned circuit layer; and a heat dissipation device comprising:

a heat dissipation plate having a first surface and a second surface opposite to each other, wherein the insulation thermally conductive layer is disposed on the first surface; and a heat dissipation base partially bonded to the heat dissipation plate, wherein a chamber is formed between the heat dissipation plate and the heat dissipation base, wherein the heat dissipation plate has a plurality of first heat dissipation bumps, and the first heat dissipation bumps are located in the chamber, wherein a gap between any two adjacent of a first part of the first heat dissipation bumps overlapping with an orthographic projection of the power device is different from a gap between any two adjacent of a second part of the first heat dissipation bumps located outside of the orthographic projection of the power device.

19. The power module according to claim 18, wherein the heat dissipation base has a capillary structure layer, and the capillary structure layer is located in the chamber.

20. The power module according to claim 18, wherein the heat dissipation plate has a plurality of second heat dissipation bumps, and the second heat dissipation bumps are located in the chamber.

* * * * *